(12) United States Patent
Namgung et al.

(10) Patent No.: US 12,554,199 B2
(45) Date of Patent: Feb. 17, 2026

(54) RESIST TOPCOAT COMPOSITION, AND METHOD OF FORMING PATTERNS USING THE COMPOSITION

(71) Applicants: SAMSUNG SDI CO., LTD., Yongin-si (KR); SAMSUNG ELECTRONICS CO., LTD., Suwon-si (KR)

(72) Inventors: Ran Namgung, Suwon-si (KR); Hyeon Park, Suwon-si (KR); Minsoo Kim, Suwon-si (KR); Daeseok Song, Suwon-si (KR); Minki Chon, Suwon-si (KR); Jun Soo Kim, Hwaseong-si (KR); Hyun-Woo Kim, Seongnam-si (KR); Hyun-Ji Song, Anyang-si (KR); Young Joo Choi, Hwaseong-si (KR); Suk-Koo Hong, Hwaseong-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 651 days.

(21) Appl. No.: 17/734,772

(22) Filed: May 2, 2022

(65) Prior Publication Data

US 2023/0026721 A1 Jan. 26, 2023

(30) Foreign Application Priority Data

Jul. 1, 2021 (KR) .................. 10-2021-0086514

(51) Int. Cl.
*G03F 7/11* (2006.01)
*C08F 220/28* (2006.01)
*C09D 133/16* (2006.01)

(52) U.S. Cl.
CPC ............ *G03F 7/11* (2013.01); *C08F 220/282* (2020.02); *C09D 133/16* (2013.01)

(58) Field of Classification Search
CPC ....... G03F 7/11; C08F 220/282; C09D 133/16
See application file for complete search history.

(56) References Cited

U.S. PATENT DOCUMENTS

| 6,764,806 B2 | 7/2004 | Jung et al. |
| 2005/0284502 A1 | 12/2005 | Watanabe et al. |

(Continued)

FOREIGN PATENT DOCUMENTS

| CN | 103186038 A | 7/2013 |
| CN | 103258720 A | 8/2013 |

(Continued)

OTHER PUBLICATIONS

KR Office Action dated Jul. 29, 2024 of the corresponding Korean Patent Application No. 10-2021-0086514, 5 pages.

(Continued)

*Primary Examiner* — Mark F. Huff
*Assistant Examiner* — Christine Curiac
(74) *Attorney, Agent, or Firm* — Womble Bond Dickinson (US) LLP

(57) ABSTRACT

A resist topcoat composition and a method of forming patterns utilizing the resist topcoat composition are disclosed. The resist topcoat composition includes an acrylic polymer comprising a structural unit comprising a hydroxy group and a fluorine; a mixture comprising a first acid compound comprising at least one fluorine; and a second acid compound different from the first acid compound and comprising at least one fluorine, the first acid compound and the second acid compound are each independently selected from a sulfonic acid compound and a sulfonimide compound, the first acid compound and the second acid compound being in a weight ratio of about 1:0.1 to about 1:50; and a solvent.

13 Claims, 1 Drawing Sheet

(56) References Cited

U.S. PATENT DOCUMENTS

| | | |
|---|---|---|
| 2006/0111550 A1 | 5/2006 | Hata et al. |
| 2006/0127803 A1 | 6/2006 | Jung et al. |
| 2006/0275697 A1 | 12/2006 | Hata et al. |
| 2007/0031755 A1* | 2/2007 | Hirayama ............. G03F 7/2041 430/311 |
| 2007/0087125 A1 | 4/2007 | Maeda et al. |
| 2007/0178407 A1 | 8/2007 | Hatakeyama et al. |
| 2010/0003615 A1 | 1/2010 | Nakamura et al. |
| 2010/0104978 A1 | 4/2010 | Sawano et al. |
| 2010/0266953 A1 | 10/2010 | Chiba et al. |
| 2011/0123933 A1 | 5/2011 | Yun et al. |
| 2013/0244438 A1 | 9/2013 | Bae et al. |
| 2015/0004544 A1* | 1/2015 | Namai ..................... G03F 7/038 546/203 |
| 2015/0086929 A1 | 3/2015 | Hatakeyama et al. |
| 2015/0185620 A1 | 7/2015 | Liu et al. |
| 2016/0097979 A1 | 4/2016 | Tsunoda et al. |
| 2016/0202612 A1 | 7/2016 | Hatakeyama et al. |
| 2017/0170008 A1 | 6/2017 | Park et al. |
| 2017/0255102 A1 | 9/2017 | Rowell et al. |
| 2017/0255103 A1* | 9/2017 | Rowell .............. H01L 21/0274 |
| 2017/0293227 A1 | 10/2017 | Nishita et al. |
| 2019/0243246 A1 | 8/2019 | Kaur et al. |
| 2020/0192220 A1* | 6/2020 | Yagi ....................... G03F 7/0045 |
| 2020/0319551 A1* | 10/2020 | Tsuchimura .......... G03F 7/0392 |
| 2020/0379353 A1 | 12/2020 | Kaur et al. |
| 2021/0055653 A1* | 2/2021 | Yoshimura ............. C07C 381/12 |
| 2023/0021469 A1 | 1/2023 | Namgung et al. |
| 2023/0024422 A1 | 1/2023 | Namgung et al. |
| 2023/0026721 A1 | 1/2023 | Namgung et al. |
| 2023/0028244 A1 | 1/2023 | Namgung et al. |
| 2023/0032354 A1 | 2/2023 | Namgung et al. |

FOREIGN PATENT DOCUMENTS

| | | | |
|---|---|---|---|
| CN | 104749888 A | 7/2015 | |
| JP | 9-291228 A | 11/1997 | |
| JP | 2005-157259 A | 6/2005 | |
| JP | 2006-23699 A | 1/2006 | |
| JP | 2006-058404 A | 3/2006 | |
| JP | 2008-286924 A | 11/2008 | |
| JP | 2009-145658 A | 7/2009 | |
| JP | 2010-275498 A | 12/2010 | |
| JP | 2011-17921 A | 1/2011 | |
| JP | 2012-68628 A | 4/2012 | |
| JP | 2013-218191 A | 10/2013 | |
| JP | 5381298 B2 | 10/2013 | |
| JP | 5617810 B2 | 9/2014 | |
| JP | 6525389 B2 | 5/2019 | |
| JP | 6818731 B2 | 1/2021 | |
| JP | 6823992 B2 | 2/2021 | |
| KR | 10-2001-0089151 A | 9/2001 | |
| KR | 10-0574496 B1 | 4/2006 | |
| KR | 10-2006-0049679 A | 5/2006 | |
| KR | 10-0574993 B1 | 5/2006 | |
| KR | 10-2006-0064054 A | 6/2006 | |
| KR | 10-0640643 B1 | 10/2006 | |
| KR | 10-2007-0041287 A | 4/2007 | |
| KR | 10-2008-0099913 A | 11/2008 | |
| KR | 10-2009-0106562 A | 10/2009 | |
| KR | 10-0926021 B1 | 11/2009 | |
| KR | 10-0962951 B1 | 6/2010 | |
| KR | 10-2010-0098024 A | 9/2010 | |
| KR | 2011009005 A * | 1/2011 | ............. C08F 20/22 |
| KR | 10-2011-0056153 A | 5/2011 | |
| KR | 10-1112599 B1 | 2/2012 | |
| KR | 10-2012-0111532 A | 10/2012 | |
| KR | 10-1384811 B1 | 4/2014 | |
| KR | 10-1428121 B1 | 8/2014 | |
| KR | 10-2014-0120212 A | 10/2014 | |
| KR | 10-1486843 B1 | 1/2015 | |
| KR | 10-2015-0080434 A | 7/2015 | |
| KR | 10-2017-0007185 A | 1/2017 | |
| KR | 10-1807198 B1 | 12/2017 | |
| KR | 10-1910832 B1 | 10/2018 | |
| KR | 10-1940003 B1 | 1/2019 | |
| KR | 10-2029693 B1 | 10/2019 | |
| KR | 10-2069186 B1 | 1/2020 | |
| KR | 10-2100432 B1 | 5/2020 | |
| KR | 10-2020-0138007 A | 12/2020 | |
| KR | 10-2195470 B1 | 12/2020 | |
| KR | 10-2203366 B1 | 1/2021 | |
| WO | 2008/035640 A1 | 3/2008 | |
| WO | 2012/064097 A2 | 5/2012 | |
| WO | WO-2019026549 A1 * | 2/2019 | ............. C08F 220/26 |
| WO | WO-2019054311 A1 * | 3/2019 | ........... C07C 381/12 |

OTHER PUBLICATIONS

Korean Office Action dated Aug. 1, 2024, of the corresponding Korean Patent Application No. 10-2021-0086530 (5 pages).
Korean Office Action dated Aug. 1, 2024, of the corresponding Korean Patent Application No. 10-2021-0086515 (6 pages).
US Office Action dated Oct. 7, 2024, issued in U.S. Appl. No. 17/749,899 (9 pages).
US Office Action dated Mar. 13, 2025, issued in U.S. Appl. No. 17/746,811 (20 pages).
US Final Office Action dated Mar. 20, 2025, issued in U.S. Appl. No. 17/749,899 (24 pages).
US Office Action dated Aug. 22, 2025, issued in U.S. Appl. No. 17/749,899 (12 pages).
Korean Office Action dated Mar. 29, 2024, of the corresponding Korean Patent Application No. 10-2021-0086511 (7 pages).
Korean Office Action issued in corresponding KR Application No. 10-2021-0086512, dated Mar. 29, 2024 (7 pages).
Korean Office Action dated Jul. 29, 2024, of the corresponding Korean Patent Application No. 10-2021-0086513 (7 pages) .
US Office Action dated Jan. 29, 2025, issued in U.S. Appl. No. 17/733,743 (37 pages).
US Office Action dated Feb. 7, 2025, issued in U.S. Appl. No. 17/847,794 (16 pages).
US Office Action dated May 7, 2025, issued in U.S. Appl. No. 17/742,260 (10 pages).
US Final Office Action dated May 19, 2025, issued in U.S. Appl. No. 17/733,743 (32 pages).
US Notice of Allowance dated Jul. 29, 2025, issued in U.S. Appl. No. 17/733,743 (8 pages).
US Notice of Allowance dated Aug. 14, 2025, issued in U.S. Appl. No. 17/742,260 (8 pages).
US Final Office Action dated Aug. 22, 2025, issued in U.S. Appl. No. 17/847,794 (24 pages).
US Final Office Action dated Sep. 17, 2025, issued in U.S. Appl. No. 17/746,811 (18 pages).

* cited by examiner

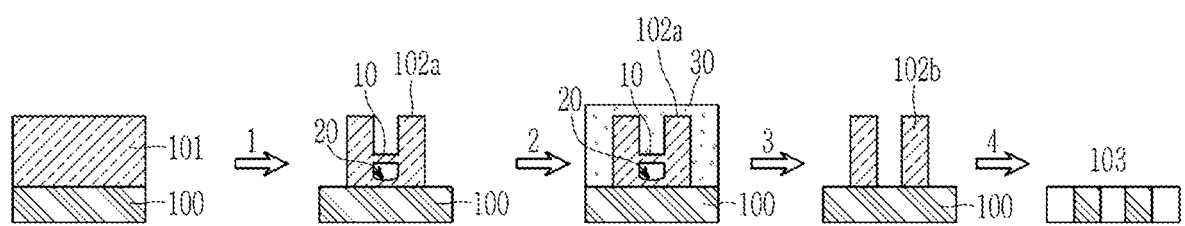

RESIST TOPCOAT COMPOSITION, AND METHOD OF FORMING PATTERNS USING THE COMPOSITION

CROSS-REFERENCE TO RELATED APPLICATION

This application claims priority to and the benefit of Korean Patent Application No. 10-2021-0086514, filed in the Korean Intellectual Property Office on Jul. 1, 2021, the entire content of which is incorporated herein by reference.

BACKGROUND

1. Field

This disclosure relates to a resist topcoat composition, and a method of forming patterns utilizing the same.

2. Description of the Related Art

Recently, the semiconductor industry has developed an ultrafine technique with a pattern of several to several tens nanometer in size (e.g., in nanometer size). Such ultrafine technique relies on (or essentially needs) effective lithographic techniques.

A typical lithographic technique involves forming a material layer on a semiconductor substrate, coating a photoresist layer thereon, exposing and developing the photoresist layer to form a photoresist pattern, and then etching the material layer utilizing the photoresist pattern as a mask.

As lithographic techniques are developed, a degree of pattern integration is increasing, and materials and technologies for solving various problems occurring in this process are desired or required.

For example, when photoresist is patterned utilizing extreme ultraviolet (EUV) as a light source, a high-resolution pattern may be realized, but single line open (SLO) defects may occur randomly on the pattern due to photon shot noise. These SLO defects may lower yield, and thus improved technology solutions are desired.

SUMMARY

An aspect according to one or more embodiments is directed toward a resist topcoat composition capable of not only realizing high-resolution patterns, but also removing single line open (SLO) defects to improve yield.

Another aspect according to one or more embodiments is directed toward a method of forming patterns utilizing the resist topcoat composition.

In an embodiment, a resist topcoat composition includes an acrylic polymer including a structural unit containing a hydroxy group and a fluorine; a mixture comprising a first acid compound comprising at least one fluorine and a second acid compound different from the first acid compound and comprising at least one fluorine, the first acid compound and the second acid compound are each independently selected from a sulfonic acid compound and a sulfonimide compound, the first acid compound and the second acid compound being (e.g., are included) in a weight ratio of about 1:0.1 to about 1:50; and a solvent.

The acrylic polymer and the mixture may be included in a weight ratio of about 3:1 to about 30:1.

A total weight of the acrylic polymer and the mixture may be included in an amount of about 0.1 wt % to about 10 wt % based on the total weight of the resist topcoat composition.

The structural unit included in the acrylic polymer may be represented by Chemical Formula 1.

Chemical Formula 1

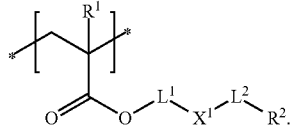

In Chemical Formula 1, $R^1$ is hydrogen or a substituted or unsubstituted C1 to C10 alkyl group, $R^2$ is hydrogen, a fluorine, a hydroxy group, or a substituted or unsubstituted C1 to C20 alkyl group, $L^1$ and $L^2$ are each independently a single bond or a substituted or unsubstituted C1 to C10 alkylene group, $X^1$ is a single bond, —O—, —S—, —S(O)—, —S(O)$_2$—, —C(O)—, —(CO)O—, —O(CO), —O(CO)O—, or —NR'—, wherein R' is hydrogen, deuterium, or a C1 to C10 alkyl group, $R^2$, $L^1$, and $L^2$ together includes a fluorine and a hydroxy group, and

* is a linking point.

The structural unit included in the acrylic polymer may be represented by Chemical Formula 2.

Chemical Formula 2

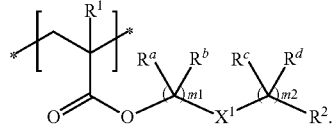

In Chemical Formula 2, $R^1$ is hydrogen or a substituted or unsubstituted C1 to C10 alkyl group, $R^a$, $R^b$, $R^c$, $R^d$, and $R^2$ are each independently hydrogen, a fluorine, a hydroxy group, or a substituted or unsubstituted C1 to C20 alkyl group, m1 and m2 are each independently an integer from 1 to 10, $X^1$ is a single bond, —O—, —S—, —S(O)—, —S(O)$_2$—, —C(O)—, —(CO)O—, —O(CO), —O(CO)O—, or —NR'—, wherein R' is hydrogen, deuterium, or a C1 to C10 alkyl group, $R^a$, $R^b$, $R^e$, $R^d$, and $R^2$ together include a fluorine and a hydroxy group, and

* is a linking point.

The structural unit containing the hydroxy group and fluorine may be selected from Group I.

Group I

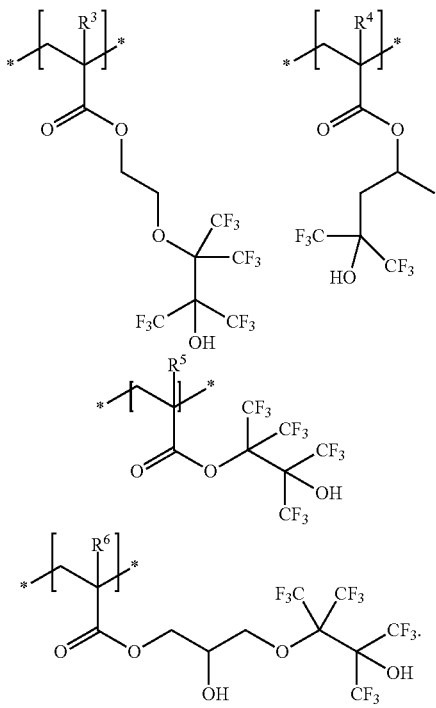

In Group I, $R^3$ to $R^6$ are each independently hydrogen or a methyl group, and * is a linking point.

A weight average molecular weight of the acrylic polymer may be about 1,000 g/mol to about 50,000 g/mol.

The first and second acid compounds may be each independently selected from compounds represented by Chemical Formula 3 to Chemical Formula 5.

Chemical Formula 3

Chemical Formula 4

Chemical Formula 5

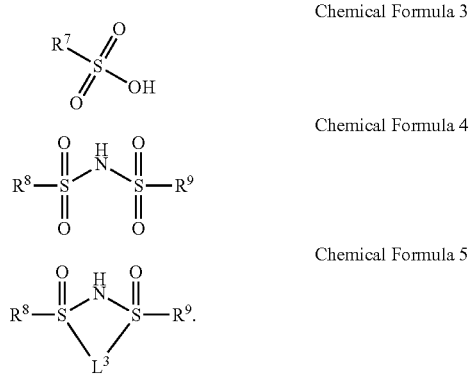

In Chemical Formula 3 to Chemical Formula 5, $R^7$ to $R^9$ are each independently a fluorine, a C1 to C20 alkyl group substituted with at least one fluorine, a C2 to C20 alkenyl group substituted with at least one fluorine, a C2 to C20 alkynyl group substituted with at least one fluorine, a C3 to C20 cycloalkyl group substituted with at least one fluorine, a C3 to C20 cycloalkenyl group substituted with at least one fluorine, a C3 to C20 cycloalkynyl group substituted with at least one fluorine, a C6 to C20 aryl group substituted with at least one fluorine, or a C1 to C20 heteroaryl group substituted with at least one fluorine, and $L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

In some embodiments, the first and second acid compounds may be each independently selected from compounds represented by Chemical Formulas of Group II.

Group II

Chemical Formula 3-1

Chemical Formula 3-2

Chemical Formula 4-1

Chemical Formula 5-1

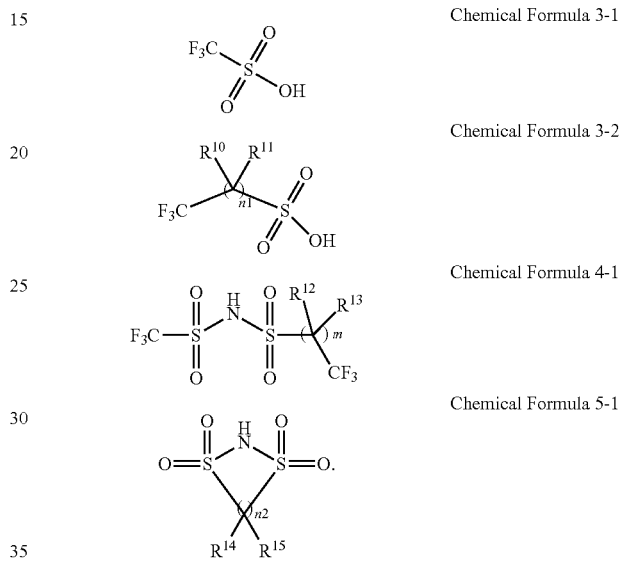

In Group II, $R^{10}$ to $R^{15}$ are each independently hydrogen, a fluorine, or a substituted or unsubstituted C1 to C10 alkyl group, n1 and n2 are each independently an integer of 1 to 10, and m is an integer from 0 to 10.

In an embodiment, the first and second acid compounds may be each independently selected from the compounds of Group II-1.

Group II-1

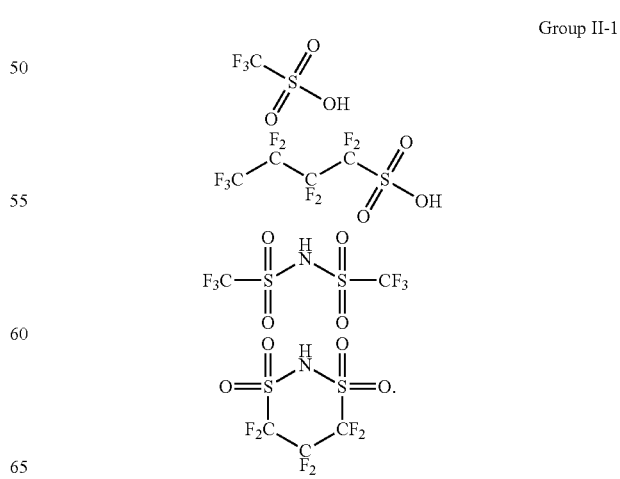

The solvent may be an ether-based solvent represented by Chemical Formula 7.

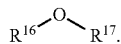

Chemical Formula 7

In Chemical Formula 7, $R^{16}$ and $R^{17}$ are each independently a substituted or unsubstituted C3 to C20 alkyl group.

The ether-based solvent may be selected from diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butylmethyl ether, butylethyl ether, butylpropyl ether, tert-butylmethyl ether, tert-butylethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, 2-octanone, 4-heptanone, and a combination thereof.

In another embodiment, a method of forming a pattern includes forming a photoresist pattern on a substrate, coating the aforementioned resist topcoat composition on the photoresist pattern, drying and heating the substrate on which the resist topcoat composition is coated to form a topcoat, and spraying a rinse solution on the substrate coated with the topcoat to remove the topcoat.

The heating of the substrate coated with the resist topcoat composition may be performed at a temperature of about 100° C. to about 500° C.

The resist topcoat composition according to an embodiment has suitable (e.g., excellent) solubility in a solvent having low reactivity with respect to the photoresist, and thus may effectively remove SLO defects without loss of photoresist fine patterns.

Because the aforementioned SLO defects may be removed by a simple process, it is desirable (e.g., advantageous) in terms of process economy. Accordingly, the resist topcoat composition according to an embodiment or a pattern prepared therefrom may be desirably (e.g., advantageously) utilized to form a fine pattern of a photoresist utilizing a high energy light source such as EUV.

BRIEF DESCRIPTION OF THE DRAWING

The drawing is a cross-sectional view for explaining a method of forming patterns utilizing a resist topcoat composition according to an embodiment.

DETAILED DESCRIPTION

Example embodiments of the present disclosure will hereinafter be described in more detail, and may be easily performed by a person skilled in the art. However, this disclosure may be embodied in many different forms and should not be construed as limited to the example embodiments set forth herein.

In the drawings, the thickness of layers, films, panels, regions, etc., may be exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to replacement of a hydrogen atom of a compound, a group, or a moiety by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term "hetero" refers to a compound or a moiety that includes 1 to 10 heteroatoms selected from nitrogen (N), oxygen (O), sulfur (S), and phosphorus (P).

In addition, in the present specification, the term "acrylic polymer" refers to an acrylic polymer and a methacrylic polymer.

Unless otherwise specified in the present specification, the weight average molecular weight is measured by dissolving a powder sample in tetrahydrofuran (THF) and then utilizing 1200 series Gel Permeation Chromatography (GPC) of Agilent Technologies (column is Shodex Company LF-804, standard sample is Shodex company polystyrene).

In addition, unless otherwise defined in the specification, "*" indicates a linking point of a structural unit or a moiety of a compound.

Hereinafter, a resist topcoat composition according to an embodiment is described in more detail.

The present disclosure relates to a resist topcoat composition capable of improving photoresist patterning by adding a simple process during the fine pattern forming process of photolithography utilizing a short-wavelength light source such as an ArF excimer laser (wavelength: 193 nm) or high energy rays such as extreme ultraviolet (EUV; wavelength: 13.5 nm) to remove SLO defects remaining in the resist pattern, and a method for forming a photoresist pattern utilizing such a topcoat.

The resist topcoat composition according to an embodiment includes an acrylic polymer including a structural unit containing a hydroxy group and a fluorine; a mixture including a first acid compound comprising at least one fluorine; and a second acid compound different from the first acid compound and comprising at least one fluorine, the first acid compound and the second acid compound are each independently selected from a sulfonic acid compound and a sulfonimide compound, the first acid compound and the second acid compound are each independently selected from a sulfonic acid compound and a sulfonimide compound, the first acid compound and the second acid compound being in a weight ratio of about 1:0.1 to about 1:50; and a solvent.

The composition according to the embodiment is coated on the photoresist, and has suitable (e.g., excellent) solubility in a solvent having low reactivity to the photoresist, so that it may be easily removed together with the removal of the SLO defects, which is desirable (e.g., advantageous) for realizing high resolution.

The formation and removal of the resist topcoat may be performed by a simple process, which is desirable (e.g., advantageous) in terms of process economy, and the yield may be improved due to the removal of the SLO defects.

Because the acrylic polymer included in the composition contains a hydroxy group and fluorine in the structural unit concurrently (e.g., at the same time), it has suitable (e.g., excellent) solubility in a solvent, may be uniformly coated on a pattern, and may reduce or minimize the influence on the resist.

In addition, the mixture included in the composition may include a first acid compound and a second acid compound different from the first acid compound, for example, the first acid compound and the second acid compound may be each independently selected from a sulfonic acid compound containing at least one fluorine and a sulfonimide compound containing at least one fluorine in a weight ratio of about 1:0.1 to about 1:50.

As described above, as the mixture including the first acid compound and the second acid compound is added, defect portions of the resist (e.g., the photoresist pattern) may be selectively removed.

The mixture may include the first acid compound and the second acid compound in a weight ratio of about 1:0.3 to about 1:40, for example, about 1:0.3 to about 1:35.

When the mixing ratio is within the above ranges, the SLO defect removal effect may be further improved.

Therefore, by utilizing resist topcoat composition according to an embodiment, a high-resolution pattern may be obtained with a high yield.

In some embodiments, the acrylic polymer and the mixture may be included in a weight ratio of about 3:1 to about 30:1, for example, about 5:1 to about 30:1, or about 6:1 to about 30:1.

By including the acrylic polymer and the mixture in the above weight ratios, the resist topcoat composition according to an embodiment may provide a resist topcoat that is easy for SLO defect removal.

A total weight of the acrylic polymer and the mixture may be about 0.1 wt % to about 10 wt % based on the total weight of the resist topcoat composition. Within the above range, resist topcoat removal may be easy.

In an embodiment, the acrylic polymer may include a structural unit represented by Chemical Formula 1.

Chemical Formula 1

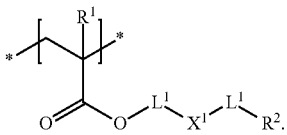

In Chemical Formula 1, $R^1$ is hydrogen or a substituted or unsubstituted C1 to C10 alkyl group, $R^2$ is hydrogen, a fluorine, a hydroxy group, or a substituted or unsubstituted C1 to C20 alkyl group, $L^1$ and $L^2$ are each independently a single bond or a substituted or unsubstituted C1 to C10 alkylene group, $X^1$ is a single bond, —O—, —S—, —S(O)—, —S(O)$_2$—, —C(O)—, —(CO)O—, —O(CO), —O(CO)O—, or —NR'—, wherein, R' is hydrogen, deuterium, or a C1 to C10 alkyl group, and $R^2$, $L^1$, and $L^2$ together include a fluorine and a hydroxy group.

The descriptions that $R^2$, $L^1$, and $L^2$ together include a fluorine and the hydroxy group may refer to that $R^2$ is a C1 to C10 alkyl group substituted with at least one fluorine and at least one hydroxy group, at least one of $L^1$ or $L^2$ is a C1 to C10 alkylene group substituted with at least one fluorine and at least one hydroxy group, one of $L^1$ or $L^2$ is a C1 to C10 alkylene group substituted with at least one fluorine and the other is a C1 to C10 allylene group substituted with at least one hydroxy group, $R^2$ is a fluorine and at least one of $L^1$ or $L^2$ is a C1 to C10 alkylene group substituted with a hydroxy group, $R^2$ is a hydroxy group and at least one of $L^1$ or $L^2$ is a C1 to C10 alkylene group substituted with a fluorine, $R^2$ is a C1 to C10 alkyl group substituted with at least one fluorine and at least one hydroxy group, or $R^2$ is a C1 to C20 alkyl group substituted with at least one hydroxy group and at least one fluorine.

In an embodiment, the acrylic polymer may include a structural unit represented by Chemical Formula 2.

Chemical Formula 2

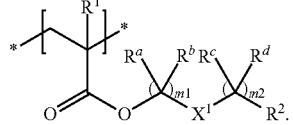

In Chemical Formula 2, $R^1$ is hydrogen or a substituted or unsubstituted C1 to C10 alkyl group, $R^a$, $R^b$, $R^e$, $R^d$, and $R^2$ are each independently hydrogen, a fluorine, a hydroxy group, or a substituted or unsubstituted C1 to C20 alkyl group, m1 and m2 are each independently an integer from 1 to 10, $X^1$ is a single bond, —O—, —S—, —S(O)—, —S(O)$_2$—, —C(O)—, —(CO)O—, —O(CO), —O(CO)O—, or —NR'—, wherein R' is hydrogen, deuterium, or a C1 to C10 alkyl group, and $R^a$, $R^b$, $R^e$, $R^d$, and $R^2$ together include a fluorine and a hydroxy group.

The descriptions that $R^a$, $R^b$, $R^e$, $R^d$, and $R^2$ together include a fluorine and a hydroxy group refer to that at least one of $R^a$, $R^b$, $R^e$, $R^d$, or $R^2$ is each independently a fluorine, and at least one of the other (the remaining groups) is each independently a hydroxy group, or at least one of $R^a$, $R^b$, $R^e$, $R^d$, or $R^2$ is each independently a C1 to C10 alkyl group substituted with a fluorine and at least one of the other (the remaining groups) is each independently a C1 to C10 alkyl group substituted with a hydroxy group, at least one of $R^a$, $R^b$, $R^e$, $R^d$, or $R^2$ is each independently a C1 to C10 alkyl group substituted with a hydroxy group and a fluorine, at least one of $R^a$, $R^b$, $R^e$, $R^d$, or $R^2$ is each independently a C1 to C20 alkyl group substituted with a hydroxy group and a fluorine, at least one of $R^a$, $R^b$, $R^e$, $R^d$, or $R^2$ is a fluorine and at least one of the other is a C1 to C10 alkyl group substituted with a hydroxy group, at least one of $R^a$, $R^b$, $R^e$, $R^d$, or $R^2$ is a hydroxy group and at least one of the other is a C1 to C10 alkyl group substituted with a fluorine, or at least one of $R^a$, $R^b$, $R^c$, $R^d$, or $R^2$ is a C1 to C20 alkyl group substituted with a fluorine and at least one of the other is a C1 to C20 alkyl group substituted with a hydroxy group.

In an embodiment, $R^1$ may be hydrogen or a methyl group, $X^1$ may be a single bond or —O—, and $R^2$ may be a fluorine, a hydroxy group, a C1 to C10 alkyl group substituted with at least one fluorine or a C1 to C10 alkyl group substituted with at least one hydroxy group.

In an embodiment, $R^c$, $R^d$, and $R^2$ of Chemical Formula 2 may together include a fluorine and a hydroxy group.

In an embodiment, at least one of $R^c$ or $R^d$ in Chemical Formula 2 may be a fluorine or a C1 to C10 alkyl group substituted with at least one fluorine, and $R^2$ may be a hydroxy group or a C1 to C10 alkyl group substituted with at least one hydroxy group.

In an embodiment, at least one of $R^c$ or $R^d$ in Chemical Formula 2 may be a hydroxy group or a C1 to C10 alkyl group substituted with at least one hydroxy group, and $R^2$ may be a fluorine or a C1 to C10 alkyl group substituted with at least one fluorine.

In an embodiment, in Chemical Formula 2, $R^c$ may be a hydroxy group or a C1 to C10 alkyl group substituted with at least one hydroxy group, $R^d$ may be a fluorine or a C1 to C10 alkyl group substituted with at least one fluorine, and $R^2$ may be a hydroxy group, a fluorine or a C1 to C10 alkyl group substituted with at least one fluorine or at least one hydroxy group.

In an embodiment, at least one of $R^c$ or $R^d$ of Chemical Formula 2 may be a fluorine or a C1 to C10 alkyl group substituted with at least one fluorine, $R^2$ may be a hydroxy group, or a C1 to C10 alkyl group substituted with at least one hydroxy group and at least one fluorine.

In an embodiment, the structural unit containing the hydroxy group and fluorine may be selected from Group I.

Group I

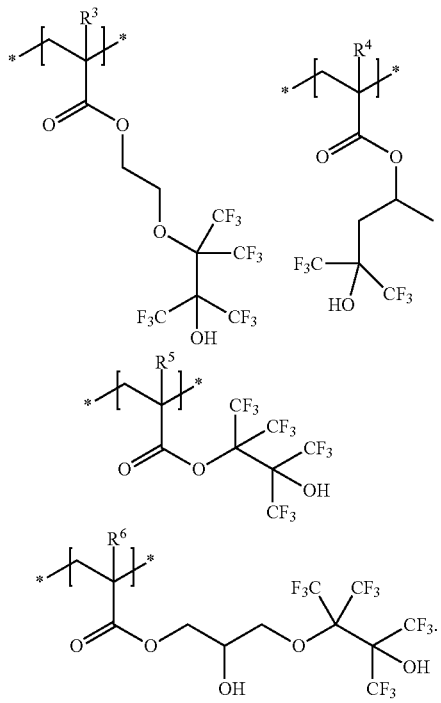

In Group I, $R^3$ to $R^6$ are each independently hydrogen or a methyl group, and * is a linking point.

The acrylic polymer may have a weight average molecular weight (Mw) of about 1,000 g/mol to about 50,000 g/mol. In an embodiment, it may have a weight average molecular weight of about 2,000 g/mol to about 30,000 g/mol, for example, about 3,000 g/mol to about 20,000 g/mol, or about 4,000 g/mol to about 10,000 g/mol, but the present disclosure is not limited thereto. When the weight average molecular weight of the acrylic polymer is within the above ranges, a carbon content and solubility in a solvent of the resist topcoat composition including the polymer may be enhanced or optimized.

In an embodiment, the mixture may include the first acid compound and the second acid compound selected from compounds represented by Chemical Formula 3 to Chemical Formula 5.

Chemical Formula 3

Chemical Formula 4

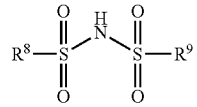

Chemical Formula 5

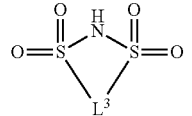

In Chemical Formula 3 to Chemical Formula 5, $R^7$ to $R^9$ are each independently a fluorine, a C1 to C20 alkyl group substituted with at least one fluorine, a C2 to C20 alkenyl group substituted with at least one fluorine, a C2 to C20 alkynyl group substituted with at least one fluorine, a C3 to C20 cycloalkyl group substituted with at least one fluorine, a C3 to C20 cycloalkenyl group substituted with at least one fluorine, a C3 to C20 cycloalkynyl group substituted with at least one fluorine, a C6 to C20 aryl group substituted with at least one fluorine, or a C1 to C20 heteroaryl group substituted with at least one fluorine, and $L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

In an embodiment, $R^7$ to $R^9$ in Chemical Formula 3 to Chemical Formula 5 may each independently be a C1 to C10 alkyl group substituted with at least one fluorine or a C6 to C20 aryl group substituted with at least one fluorine, and $L^3$ may be a C1 to C5 alkylene group substituted with at least one fluorine. In an embodiment, the first acid compound and the second acid compound selected from the compounds represented by Chemical Formula 3 to Chemical Formula 5 may be two kinds of acid compounds selected from the compounds represented by Chemical Formula 3, two kinds of acid compounds selected from the compounds represented by Chemical Formula 4, or two kinds of acid compounds selected from the acid compounds represented by Chemical Formula 5; or selected from acid compounds including one compound represented by Chemical Formula 3 and one compound represented by Chemical Formula 4, or one compound represented by Chemical Formula 3 and one compound represented by Chemical Formula 5.

In an embodiment, the mixture may include the first acid compound and the second acid compound each independently selected from compounds represented by the chemical formulas of Group II.

Group II

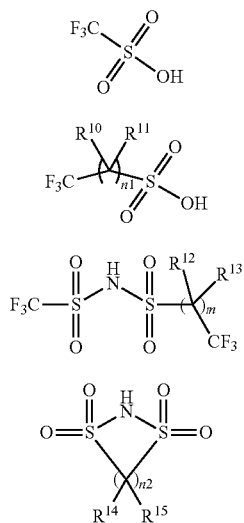

Chemical Formula 3-1

Chemical Formula 3-2

Chemical Formula 4-1

Chemical Formula 5-1

In Group II, $R^{10}$ to $R^{15}$ are each independently hydrogen, a fluorine, or a substituted or unsubstituted C1 to C10 alkyl group, n1 and n2 are each independently an integer of 1 to 10, and m is an integer from 0 to 10.

In an embodiment, the mixture may be a mixture of the acid compound represented by Chemical Formula 3-1 and the acid compound represented by Chemical Formula 3-2, a mixture of the acid compound represented by Chemical Formula 3-1 and the acid compound represented by Chemical Formula 4, a mixture of the acid compound represented by Chemical Formula 3-1 and the acid compound represented by Chemical Formula 5, or a mixture of the acid compound represented by Chemical Formula 4-1 and the acid compound represented by Chemical Formula 5-1.

In an embodiment, the mixture may include two kinds of acid compounds selected from the compounds of Group II-1.

Group II-1

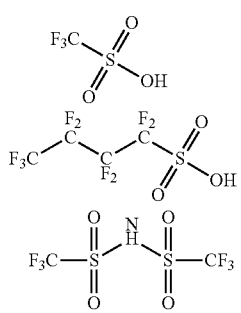

-continued

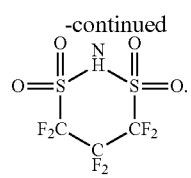

In some embodiments, the resist topcoat composition may further include at least one other polymer selected from an epoxy-based resin, a novolac-based resin, a glycoluril-based resin, and a melamine-based resin, but the present disclosure is not limited thereto.

The resist topcoat composition may further include an additive including a surfactant, a thermal acid generator, a plasticizer, or a combination thereof.

The surfactant may be, for example, an alkylbenzene sulfonic acid salt, an alkylpyridinium salt, polyethylene glycol, a quaternary ammonium salt, and/or the like, but the present disclosure is not limited thereto.

The thermal acid generator may be, for example, an acid compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carboxylic acid, benzointosylate, 2-nitrobenzyl tosylate, and/or other organic sulfonic acid alkyl esters, but the present disclosure is not limited thereto.

The additive may be included in an amount of about 0.001 to about 40 parts by weight based on 100 parts by weight of the resist topcoat composition. Within the above range, solubility may be improved without changing the optical properties of the resist topcoat composition.

The solvent may be an ether-based solvent represented by Chemical Formula 7.

Chemical Formula 7

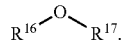

In Chemical Formula 7, $R^{16}$ and $R^{17}$ are each independently a substituted or unsubstituted C3 to C20 alkyl group.

In an embodiment, the solvent may be selected from diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butyl methyl ether, butyl ethyl ether, butyl propyl ether, tert-butyl methyl ether, tert-butyl ethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, 2-octanone, 4-heptanone, and a combination thereof.

The ether-based solvent may have sufficient solubility or dispersibility for the aforementioned composition.

According to another embodiment, a photoresist pattern is prepared utilizing the aforementioned resist topcoat composition. The resist topcoat may be in the state of a cured film through a heat treatment process after coating the aforementioned resist topcoat composition on, for example, a photoresist pattern.

Hereinafter, a method of forming patterns utilizing the aforementioned resist topcoat composition is described with reference to the drawing.

A method of forming patterns according to an embodiment includes forming a photoresist pattern on a substrate (1), coating the aforementioned resist topcoat composition on the photoresist pattern, drying and heating the substrate on which the resist topcoat composition is coated to form a topcoat (2), and spraying a rinse solution on the substrate coated with the topcoat to remove the topcoat (3).

The forming of the photoresist pattern on a substrate (1) may include coating a semiconductor resist composition on the substrate 100 by spin coating, slit coating, inkjet printing, etc., drying and heat treating the coated semiconductor photoresist composition to form a photoresist film 101, and selectively exposing and developing the photoresist film 101 to dissolve and remove the photoresist film corresponding to the exposed area to form a photoresist pattern (e.g., a preliminary photoresist pattern) 102a.

The forming of the preliminary photoresist pattern 102a may be performed by a suitable (e.g., known) method, and details thereof will not be provided.

In the preliminary photoresist pattern 102a formed in this way, the bridge 10 connecting the adjacent pattern(s) and the scum 20 remaining in the gap between the patterns may occur, which may cause later formation of SLO defects in the thin film pattern, and thereby cause a decrease of yield.

In the method of forming patterns according to an embodiment, in order to remove the bridge 10 and the scum 20 after the photoresist pattern is formed, the method may further include coating the aforementioned resist topcoat composition on the preliminary photoresist pattern 102a; drying and heating the substrate 100 coated with the resist topcoat composition to form a topcoat 30 (2); and spraying a rinse solution on the substrate 100 coated with the topcoat to remove the topcoat 30 (3).

The heating of the substrate 100 coated with the resist topcoat composition may be performed at a temperature of about 100° C. to about 500° C.

In the removing of the topcoat 30 by spraying a rinse solution, a solvent having low reactivity with respect to the photoresist and high solubility with respect to the topcoat may be desirable (e.g., advantageous), and the aforementioned solvent may be utilized.

As such, in the photoresist pattern 102b formed after performing the coating of the topcoat 30 (2) and removing of the topcoat 30 (3), the bridge 10 and the scum 20 may be removed, compared with the photoresist pattern (e.g., the preliminary photoresist pattern) 102a formed before performing the processes (2) and (3), so that the patterning of the photoresist may be improved.

The thin film pattern 103 may be finally formed through a process (4) of etching the exposed thin film of the substrate 100 by applying (e.g., utilizing) the photoresist pattern 102b as an etching mask, and in the thin film pattern formed in this way, SLO defects may be effectively removed or reduced without loss of the fine pattern.

The thin film may be etched, for example, by dry etching utilizing an etching gas, and the etching gas may be, for example, $CHF_3$, $CF_4$, $Cl_2$, $BCl_3$, or a mixture thereof.

In the exposure process described above, the thin film pattern formed using the photoresist pattern 102b that is formed by the exposure process performed utilizing the EUV light source may have a width corresponding to the photoresist pattern 102b. In an embodiment, the photoresist pattern 102b may have a width of about 5 nm to about 100 nm. In an embodiment, the thin film pattern 103 formed from the photoresist pattern 102b that is formed by the exposure process performed utilizing an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm, the same as or similar to the photoresist pattern 102b, and may, for example, be formed in a width of less than or equal to about 20 nm.

Hereinafter, the present disclosure will be described in more detail through examples relating to the synthesis of the aforementioned polymer and the preparation of a resist topcoat composition including the same. However, the present disclosure is not limited by the following examples.

SYNTHESIS EXAMPLES

Synthesis of Acrylic Polymer

Synthesis Example 1: Synthesis of Monomer 20 g (59.86 mmol) of hexafluoro-2,3-bis(trifluoromethyl)-2,3-butanediol(perfluoropinacol), 7.79 g (59.86 mmol) of 2-(hydroxyethyl)methacrylate, and 18.84 g (71.84 mmol) of triphenylphosphine ($Ph_3P$) were mixed in 110 ml (mL) of diethyl ether under a nitrogen atmosphere and then, stirred. After stirring for 30 minutes, the mixture was cooled down to 0° C., and another mixture of 14.52 g (71.84 mmol) of diisopropylazodicarboxylate (DIAD) and 35 ml of diethyl ether was slowly added thereto over 2 hours. Subsequently, the obtained mixture was stirred at room temperature for 24 hours and then, concentrated. The concentrated mixture was dissolved in dichloromethane and then, treated through column chromatography by utilizing silica gel to separate a synthesized material. The separated material was distilled under a reduced pressure, obtaining 2-[3,3,3-trifluoro-2-hydroxy-1,1,2-tris(trifluoromethyl)propoxy]ethyl 2-methyl-2-propenoate represented by Chemical Formula 1a.

* $^1$H-NMR (Acetone-d6): δ1.90 (3H, t), 4.36 (4H, m), 5.63 (1H, t), 6.09 (1H, t), 8.34 (1H, s)
* $^{19}$F-NMR (Acetone-d6): δ−70.12 (6F, m), −65.38 (6F, m)

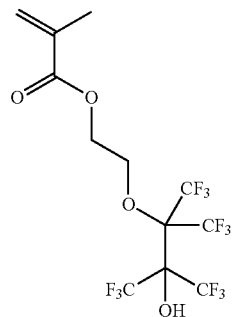

Chemical Formula 1a

Synthesis Example 2: Preparation of Polymer P1

The compound represented by Chemical Formula 1a (37.5 g, 84.0 mmol) according to Synthesis Example 1, dimethyl 2,2'-azobis(2-methylpropionate) (2.5 g, 10.9 mmol, Wako Chemical, Inc.), and diisoamyl ether (DIAE, 60 g) as monomers were put in a 500 ml (mL) 2-necked round flask under a nitrogen atmosphere, and a condenser was connected thereto. After increasing the temperature to 110° C., the obtained mixture was reacted for 24 hours, and the reaction solution was cooled down to room temperature. The reaction solution was dropped into a 1 L wide-mouth bottle containing 225 g of heptane, while stirred, producing gum, and then, a supernatant was removed therefrom. After dissolving the remaining gum in 40 g of DIAE, 180 g of heptane was added thereto to form precipitates, and a supernatant was removed therefrom, which was repeated three times to remove monomers and oligomers.

Finally, 22.5 g of Polymer P1 including a structural unit represented by Chemical Formula 1b (a weight average molecular weight: 4,500) was obtained.

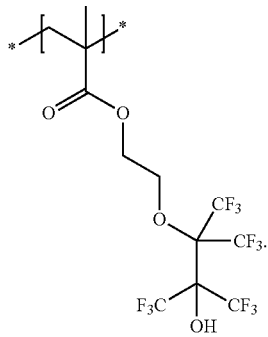

Chemical Formula 1b

In Chemical Formula 1 b, * is a linking point (e.g., to other units of the copolymer backbone).

Preparation of Resist Topcoat Composition

Examples 1 to 19 and Comparative Examples 1 and 2

Each resist topcoat composition according to Examples 1 to 19 and Comparative Examples 1 and 2 was prepared by mixing the Polymer P1 (e.g., Acrylic Polymer P1) according to Synthesis Example 2, a mixture including two selected from the acid compounds represented by A1 to A6, and diisoamyl ether (DIAE) in compositions shown in Table 1, stirring the mixture at room temperature of 23° C. for 24 hours, and filtering it with a TEFLON (tetrafluoroethylene) filter having a pore size of 0.45 µm.

Acid Compound

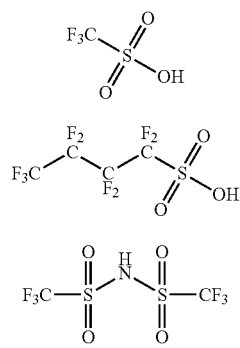

-continued

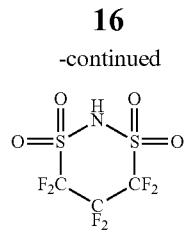

A4

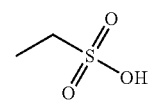

A5

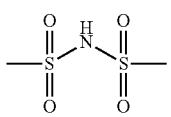

A6

TABLE 1

| | Mixture | | | | | | |
|---|---|---|---|---|---|---|---|
| | First acid compound | | Second acid compound | | Acrylic polymer | | Solvent |
| Composition | Type | Content (wt %) | Type | Content (wt %) | Type | Content (wt %) | (DIAE) (wt %) |
| Example 1 | A1 | 0.13 | A2 | 0.04 | P1 | 4.3 | 95.53 |
| Example 2 | A1 | 0.13 | A2 | 0.09 | P1 | 4.3 | 95.49 |
| Example 3 | A1 | 0.13 | A2 | 0.13 | P1 | 4.3 | 95.44 |
| Example 4 | A1 | 0.13 | A2 | 0.17 | P1 | 4.3 | 95.40 |
| Example 5 | A1 | 0.13 | A2 | 0.22 | P1 | 4.3 | 95.36 |
| Example 6 | A1 | 0.02 | A3 | 0.30 | P1 | 4.3 | 95.38 |
| Example 7 | A1 | 0.02 | A3 | 0.43 | P1 | 4.3 | 95.25 |
| Example 8 | A1 | 0.02 | A3 | 0.52 | P1 | 4.3 | 95.16 |
| Example 9 | A1 | 0.02 | A3 | 0.65 | P1 | 4.3 | 95.03 |
| Example 10 | A1 | 0.09 | A3 | 0.22 | P1 | 4.3 | 95.40 |
| Example 11 | A1 | 0.09 | A3 | 0.30 | P1 | 4.3 | 95.31 |
| Example 12 | A1 | 0.09 | A3 | 0.43 | P1 | 4.3 | 95.18 |
| Example 13 | A1 | 0.02 | A4 | 0.30 | P1 | 4.3 | 95.38 |
| Example 14 | A1 | 0.02 | A4 | 0.43 | P1 | 4.3 | 95.25 |
| Example 15 | A1 | 0.02 | A4 | 0.52 | P1 | 4.3 | 95.16 |
| Example 16 | A1 | 0.02 | A4 | 0.65 | P1 | 4.3 | 95.03 |
| Example 17 | A1 | 0.09 | A4 | 0.30 | P1 | 4.3 | 95.31 |
| Example 18 | A1 | 0.09 | A4 | 0.43 | P1 | 4.3 | 95.18 |
| Example 19 | A3 | 0.52 | A4 | 0.65 | P1 | 4.3 | 94.54 |
| Comparative Example 1 | A2 | 0.40 | — | — | P1 | 4.3 | 95.30 |
| Comparative Example 2 | A1 | 0.09 | A6 | 0.22 | P1 | 4.3 | 95.40 |

Evaluation 1: Evaluation of Solubility

Each resist topcoat composition according to Examples 1 to 19 and Comparative Examples 1 and 2 was prepared and stirred for 24 hours and then, observed with naked eyes to check whether or not precipitates were produced, and the results are shown in Table 2.

(No precipitation—Solubility O, with precipitation—Solubility X)

Evaluation 2: Evaluation of Non-Pattern Wafer (NPW) Strip

Each resist topcoat composition was spin coated on a silicon substrate coated with a photoresist (PR) and then, heat-treated on a hot plate at 110° C. for 1 minute, forming an about 50 nm-thick topcoat for a photoresist. Subsequently, the substrate coated with the topcoat was rinsed with a rinse solution (diisoamyl ether (DIAE)), heat-treated on a hot plate at 110° C. for 1 minute and then, measured with respect to a thickness change of the photoresist (PR), which was utilized to calculate an NPW strip according to the following equation, and the results are shown in Table 2.
NPW strip=PR thickness (nm) after forming and rinsing a resist topcoat−initial PR thickness (nm)

Evaluation 3: Evaluation of SLO Defects

On a 12 inch silicon substrate, a lower SiON film—a spin-on carbon film—a topcoat were sequentially formed. On the SiON film, a 1:1 line/space photoresist pattern with a pitch of 36 nm was formed in an EUV lithography method. The photoresist pattern was transferred into the lower SiON film through dry etching utilizing plasma. Then, all defects including bridge defects between the line patterns were inspected with a defect analysis equipment utilizing a deep UV (DUV) laser. The detected defects were classified by utilizing SEM, providing the number of the detected defects per unit area (ea/cm$^2$).

Herein, when the number of SLO defects without utilizing the resist topcoat compositions was converted into 100, '⊚' was given to a case where the number of defects was less than or equal to 60%, '○' was given to a case where the number of defects was greater than 60% and less than or equal to 80%, and 'X' was given to a case where the number of defects was greater than 80%.

TABLE 2

|  | Solubility | NPW strip | SLO Defects |
|---|---|---|---|
| Example 1 | ○ | −2.9 | ⊚ |
| Example 2 | ○ | −3.0 | ⊚ |
| Example 3 | ○ | −2.8 | ⊚ |
| Example 4 | ○ | −2.8 | ⊚ |
| Example 5 | ○ | −2.7 | ⊚ |
| Example 6 | ○ | −3.7 | ⊚ |
| Example 7 | ○ | −3.4 | ⊚ |
| Example 8 | ○ | −3.5 | ⊚ |
| Example 9 | ○ | −3.5 | ⊚ |
| Example 10 | ○ | −3.1 | ⊚ |
| Example 11 | ○ | −3.0 | ⊚ |
| Example 12 | ○ | −3.2 | ⊚ |
| Example 13 | ○ | −3.8 | ⊚ |
| Example 14 | ○ | −3.6 | ⊚ |
| Example 15 | ○ | −3.2 | ⊚ |
| Example 16 | ○ | −2.7 | ⊚ |
| Example 17 | ○ | −3.0 | ⊚ |
| Example 18 | ○ | −2.6 | ⊚ |
| Example 19 | ○ | −2.7 | ⊚ |
| Comparative Example 1 | ○ | −2.8 | ○ |
| Comparative Example 2 | ○ | −1.3 | X |

Referring to Table 2, when the resist topcoat compositions of Examples 1 to 19 were applied, compared with when the resist topcoat compositions of Comparative Examples 1 and 2 were applied, suitable (e.g., excellent) solubility, suitable NPW strip (effective when −5.0 nm to −2.5 nm), and reduction or elimination of defect were exhibited.

As used herein, singular forms such as "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items.

The term "may" will be understood to refer to "one or more embodiments," some of which include the described element and some of which exclude that element and/or include an alternate element. Similarly, alternative language such as "or" refers to "one or more embodiments," each including a corresponding listed item.

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, the certain embodiments of the present disclosure have been described and illustrated, however, it is apparent to a person with ordinary skill in the art that the present disclosure is not limited to the embodiment as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure, and equivalents thereof.

DESCRIPTION OF SOME OF THE SYMBOLS

1: forming a photoresist pattern on a substrate
2: coating a resist topcoat composition on the photoresist pattern and drying and heating the substrate on which the resist topcoat composition is coated to form a topcoat
3: spraying a rinse solution on the substrate coated with the topcoat to remove the topcoat
4: etching the exposed thin film by applying the photoresist pattern as an etching mask
10: bridge 20: scum
30: topcoat
100: substrate 101: photoresist film
102a: preliminary photoresist pattern formed before performing coating and removing the topcoat
102b: photoresist pattern formed after performing coating and removing the topcoat
103: thin film pattern

What is claimed is:

1. A resist topcoat composition, comprising
an acrylic polymer comprising a structural unit comprising a hydroxy group and a fluorine;
a mixture comprising:
a first acid compound comprising at least one fluorine; and
a second acid compound different from the first acid compound and comprising at least one fluorine, the first acid compound and the second acid compound are each independently selected from compounds represented by Chemical Formula 3 to Chemical Formula 5, the first acid compound and the second acid compound being in a weight ratio of about 1:0.1 to about 1:50; and a solvent:

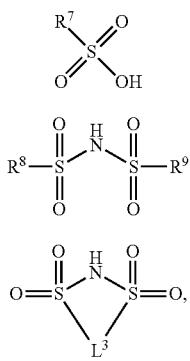

Chemical Formula 3

Chemical Formula 4

Chemical Formula 5 and wherein in Chemical Formula 3 to Chemical Formula 5,
$R^7$ to $R^8$ are each independently a fluorine, a C1 to C20 alkyl group substituted with at least one fluorine, and
$L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

2. The resist topcoat composition of claim 1, wherein the acrylic polymer and the mixture are included in a weight ratio of about 3:1 to about 30:1.

3. The resist topcoat composition of claim 1, wherein a total weight of the acrylic polymer and the mixture is about 0.1 wt % to about 10 wt % based on a total weight of the resist topcoat composition.

4. The resist topcoat composition of claim 1, wherein the structural unit comprised in the acrylic polymer is represented by Chemical Formula 1:

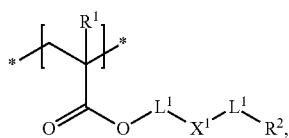

Chemical Formula 1 and wherein, in Chemical Formula 1,
$R^1$ is hydrogen or a substituted or unsubstituted C1 to C10 alkyl group,
$R^2$ is hydrogen, a fluorine, a hydroxy group, or a substituted or unsubstituted C1 to C20 alkyl group,
$L^1$ and $L^2$ are each independently a single bond or a substituted or unsubstituted C1 to C10 alkylene group,
$X^1$ is a single bond, —O—, —S—, —S(O)—, —S(O)$_2$—, —C(O)—, —(CO)O—, —O(CO), —O(CO)O—, or —NR'—, wherein R' is hydrogen, deuterium, or a C1 to C10 alkyl group, $R^2$, $L^1$, and $L^2$ together comprises a fluorine and a hydroxy group, and
* is a linking point.

5. The resist topcoat composition of claim 1, wherein the structural unit of the acrylic polymer is represented by Chemical Formula 2:

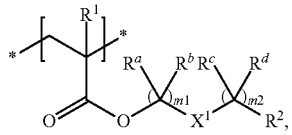

Chemical Formula 2 and wherein, in Chemical Formula 2,
$R^1$ is hydrogen or a substituted or unsubstituted C1 to C10 alkyl group,
$R^a$, $R^b$, $R^c$, $R^d$, and $R^2$ are each independently hydrogen, a fluorine, a hydroxy group, or a substituted or unsubstituted C1 to C20 alkyl group,
m1 and m2 are each independently an integer from 1 to 10,
$X^1$ is a single bond, —O—, —S—, —S(O)—, —S(O)$_2$—, —C(O)—, —(CO)O—, —O(CO), —O(CO)O—, or —NR'—, wherein R' is hydrogen, deuterium, or a C1 to C10 alkyl group,
$R^a$, $R^b$, $R^c$, $R^d$, and $R^2$ together comprises a fluorine and a hydroxy group, and
* is a linking point.

6. The resist topcoat composition of claim 1, wherein the structural unit comprising the hydroxy group and fluorine is selected from Group I:

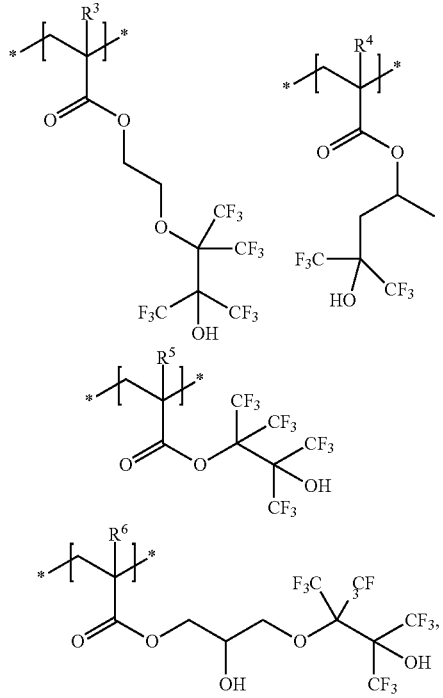

Group I and wherein, in Group I,
$R^3$ to $R^6$ are each independently hydrogen or a methyl group, and
* is a linking point.

7. The resist topcoat composition of claim 1, wherein a weight average molecular weight of the acrylic polymer is about 1,000 g/mol to about 50,000 g/mol.

8. The resist topcoat composition of claim 1, wherein the first and second acid compounds are each independently selected from compounds represented by the chemical formulas of Group II:

Group II

Chemical Formula 3-1

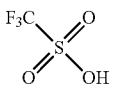

Chemical Formula 3-2

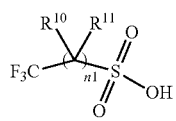

Chemical Formula 4-1

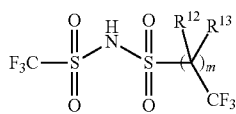

Chemical Formula 5-1

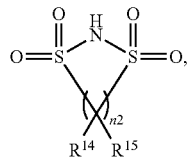

and wherein, in Group II, $R^{10}$ to $R^{15}$ are each independently hydrogen, a fluorine, or a substituted or unsubstituted C1 to C10 alkyl group, n1 and n2 are each independently an integer of 1 to 10, and m is an integer from 0 to 10.

9. The resist topcoat composition of claim 1, wherein the first and second acid compounds are each independently selected from the compounds of Group II-1:

Group II-1

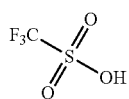

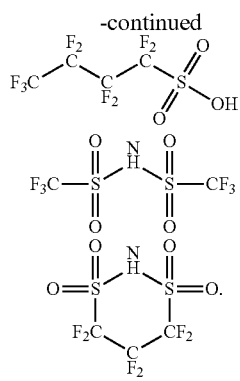

10. The resist topcoat composition of claim 1, wherein the solvent is an ether-based solvent represented by Chemical Formula 7:

Chemical Formula 7

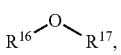

and wherein, in Chemical Formula 7, $R^{16}$ and $R^{17}$ are each independently a substituted or unsubstituted C3 to C20 alkyl group.

11. The resist topcoat composition of claim 10, wherein the ether-based solvent is selected from diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butyl methyl ether, butyl ethyl ether, butyl propyl ether, tert-butyl methyl ether, tert-butyl ethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, 2-octanone, 4-heptanone, and combinations thereof.

12. A method of forming a pattern, the method comprising forming a photoresist pattern on a substrate,
coating the resist topcoat composition of claim 1 on the photoresist pattern,
drying and heating the substrate on which the resist topcoat composition is coated to form a topcoat, and
spraying a rinse solution on the substrate coated with the topcoat to remove the topcoat.

13. The method of claim 12, wherein the heating of the substrate coated with the resist topcoat composition is performed at a temperature of about 100° C. to about 500° C.

* * * * *